US009338913B2

(12) United States Patent
Feichtinger et al.

(10) Patent No.: US 9,338,913 B2
(45) Date of Patent: May 10, 2016

(54) ELECTRIC CERAMIC COMPONENT WITH ELECTRIC SHIELDING

(75) Inventors: Thomas Feichtinger, Graz (AT); Georg Krenn, Graz (AT); Jerzy Kudlaty, Graz (AT)

(73) Assignee: EPCOS AG, Munich (DE)

( * ) Notice: Subject to any disclaimer, the term of this patent is extended or adjusted under 35 U.S.C. 154(b) by 356 days.

(21) Appl. No.: 13/984,274

(22) PCT Filed: Feb. 2, 2012

(86) PCT No.: PCT/EP2012/051786
§ 371 (c)(1),
(2), (4) Date: Oct. 18, 2013

(87) PCT Pub. No.: WO2012/107349
PCT Pub. Date: Aug. 16, 2012

(65) Prior Publication Data
US 2014/0041931 A1 Feb. 13, 2014

(30) Foreign Application Priority Data
Feb. 8, 2011 (DE) .......................... 10 2011 010 611

(51) Int. Cl.
*H05K 7/00* (2006.01)
*H01C 7/18* (2006.01)
*H01G 4/012* (2006.01)
*H01G 4/30* (2006.01)

(52) U.S. Cl.
CPC .. *H05K 7/00* (2013.01); *H01C 7/18* (2013.01); *H01G 4/012* (2013.01); *H01G 4/30* (2013.01)

(58) Field of Classification Search
CPC ....... H01G 4/00; H01G 4/002; H01G 4/4005; H01G 4/12; H01G 4/224; H01G 4/255; H01G 4/30; H01G 4/35; H01G 4/012; H05K 7/00; H05K 7/02; H01C 7/18
USPC ............ 174/549, 50, 520; 361/303, 304, 311, 361/306.3, 309, 313, 302, 307, 301.4, 301.2
See application file for complete search history.

(56) References Cited

U.S. PATENT DOCUMENTS 7,067,959 B2    6/2006  Takeshima et al.
7,190,566 B2 *  3/2007  Tonogai ................. H01G 4/012
                                                         361/303

(Continued)

FOREIGN PATENT DOCUMENTS

CN    1909125 A    2/2007
DE    10354026 A1  7/2004

(Continued)

*Primary Examiner* — Angel R Estrada
(74) *Attorney, Agent, or Firm* — McDermott Will & Emery LLP

(57) ABSTRACT

The electric ceramic component has a main part (9) made of a dielectric material, an active region (3) being disposed in said main part. At least one outer contact (1, 1') is arranged on the main part. A feed line region (2, 2') connects the outer contact to the active region. An electrode (4, 4', 5, 5', 6, 6') is arranged in the main part so as to adjoin the feed line region and is connected to the outer contact in an electrically conductive manner but not to the active region.

4 Claims, 3 Drawing Sheets

(56) References Cited

U.S. PATENT DOCUMENTS

Figure 1:
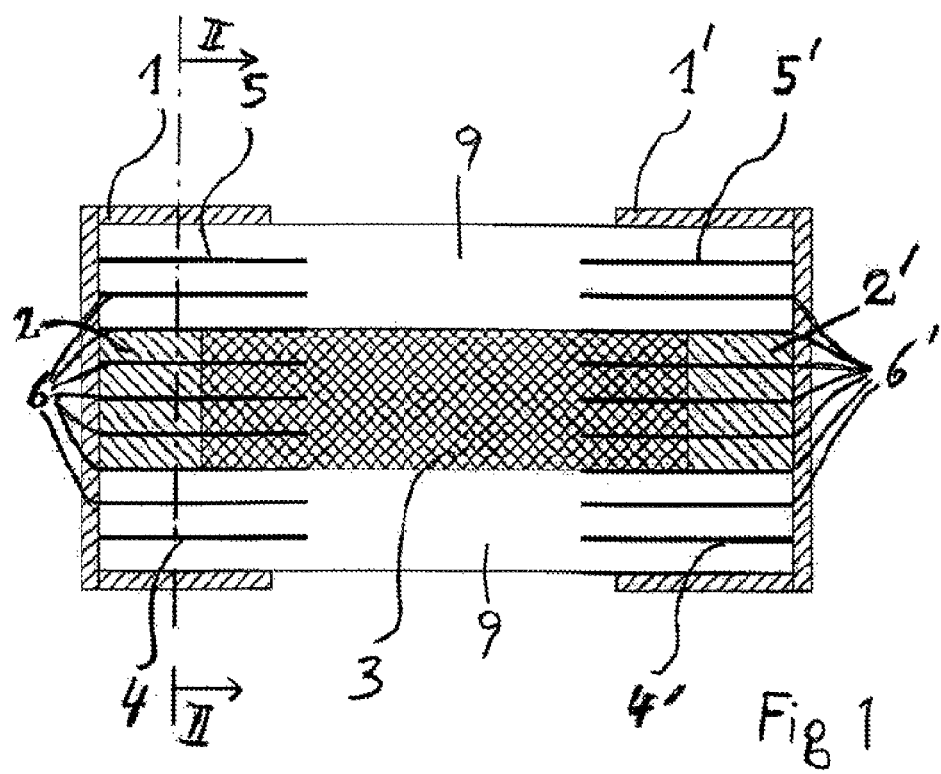

| | | | |
|---|---|---|---|
| 7,509,716 B2 | 3/2009 | Omura et al. | |
| 7,630,208 B2 * | 12/2009 | Lee | H01G 4/012 361/303 |
| 8,050,012 B2 * | 11/2011 | Lee | H01G 4/232 361/303 |
| 8,179,210 B2 | 5/2012 | Feichtinger | |
| 8,659,872 B2 * | 2/2014 | Togashi | H01G 4/012 361/306.3 |
| 8,804,302 B2 * | 8/2014 | Sato | H01G 4/12 361/306.3 |
| 9,042,080 B2 * | 5/2015 | Kim | H01G 4/30 361/301.2 |
| 2007/0025054 A1 | 2/2007 | Tonogai et al. | |
| 2009/0059469 A1 | 3/2009 | Lee et al. | |
| 2010/0109804 A1 | 5/2010 | Feichtinger | |
| 2010/0271752 A1 | 10/2010 | Ishida et al. | |

FOREIGN PATENT DOCUMENTS

| | | |
|---|---|---|
| DE | 102005033085 A1 | 1/2007 |
| DE | 112005001022 T5 | 3/2007 |
| DE | 102007020783 A1 | 11/2008 |
| JP | 2000133545 A | 5/2000 |
| JP | 2006203167 A | 8/2006 |
| JP | 2007-042743 A | 2/2007 |
| JP | 2009060114 A | 3/2009 |
| JP | 2009527919 A | 7/2009 |
| JP | 2010258070 A | 11/2010 |
| JP | 2011530831 A | 12/2011 |
| JP | 2012156315 A | 8/2012 |
| KR | 1020090022878 | 3/2009 |

\* cited by examiner

ELECTRIC CERAMIC COMPONENT WITH ELECTRIC SHIELDING

The invention relates to an electric ceramic component, in particular a surface-mountable multilayer component, which is provided with external electrical terminals and electrical shielding.

DE 10 2007 020 783 A1 describes a multilayer electric component which comprises a base body having a stack of dielectric layers and electrode layers arranged alternately above one another. An electrically uncontacted metal shielding structure is surrounded by dielectric material and has the function of protecting regions of the multilayer component from being influenced by external electromagnetic fields, which may occur for example because of stray capacitances.

Often, it is not possible to avoid electronic ceramic components being exposed to detrimental influences during production and use. As damaging, in particular aggressive chemical substances may be mentioned, for example chlorine compounds as fluxes which are used during soldering. It is assumed that the effect of such chemical substances is that an electrical voltage applied during operation of the ceramic component causes diffusion into the electrically active region of the component, so that the electrical properties of the ceramic component are detrimentally modified. In order to prevent this, the surfaces of the ceramic components are usually protected by a passivating layer.

It is an object of the present invention to provide an electric ceramic component in which undesired modification of the electrical properties is prevented, or at least greatly reduced. This object is achieved by the electric ceramic component having the features of claim 1. Refinements may be found in the dependent claims.

The invention is based on the discovery that undesired modifications of the electrical properties of ceramic components may be caused by diffusion of charge carriers from the outer contacts into the active region. In order to prevent this effectively, additional electrodes are provided, which are always at the same electrical potential as the outer contacts and electrically shield the electrical connections which lead from the outer contacts to the inner active region.

The electric ceramic component has a base body made of a dielectric material, in which an active region is arranged. At least one outer contact is arranged on the base body. A supply region connects the outer contact to the active region. An electrode is arranged next to the supply region in the base body and is electrically conductively connected to the outer contact, but not to the active region.

In one embodiment, the electrode is formed as a plate and is arranged at a distance from the supply region.

In another embodiment, on an opposite side of the supply region from the electrode, a further electrode is arranged next to the supply region in the base body and is electrically conductively connected to the outer contact, but likewise not to the active region.

In another embodiment, a multiplicity of further electrodes are arranged next to the supply region in the base body and are electrically conductively connected to the outer contact, but not to the active region. The electrode and the further electrodes are formed as plates and are arranged in mutually parallel planes at distances from one another, this being referred to below and in the claims as "coplanar", and surround the supply region where the supply region is not adjacent to the outer contact or to the active region.

In another embodiment, on an opposite side of the base body from the outer contact, a further outer contact is arranged on the base body, and a further supply region is provided, which connects the further outer contact to the active region. A further electrode is arranged next to the further supply region in the base body and is electrically conductively connected to the further outer contact, but not to the active region.

In another embodiment, a plurality of further electrodes are arranged next to the further supply region in the base body and are electrically conductively connected to the further outer contact, but not to the active region.

In another embodiment, the electrodes arranged next to the supply region and the further supply region form a symmetrical arrangement in relation to the active region.

In another embodiment, a central outer contact is arranged between the outer contact and the further outer contact on the base body. The term "central outer contact" is used here and in the claims in order to distinguish it from the aforementioned outer contacts, which may be arranged in particular at ends of the base body. The central outer contact does not, however, have to be arranged at the geometrical center of the ceramic component. A central, in this sense, supply region is provided, which connects the central outer contact to the active region. A likewise in this sense central electrode is arranged next to the central supply region in the base body and is electrically conductively connected to the central outer contact, but not to the active region.

In another embodiment, the central electrode is formed as a plate and is arranged at a distance from the central supply region.

In another embodiment, on an opposite side of the central supply region from the central electrode, a further central electrode is arranged next to the central supply region in the base body and is electrically conductively connected to the central outer contact, but not to the active region.

A more detailed description of examples of the multilayer piezoelectric component is given below with the aid of the appended figures.

Figure 2:
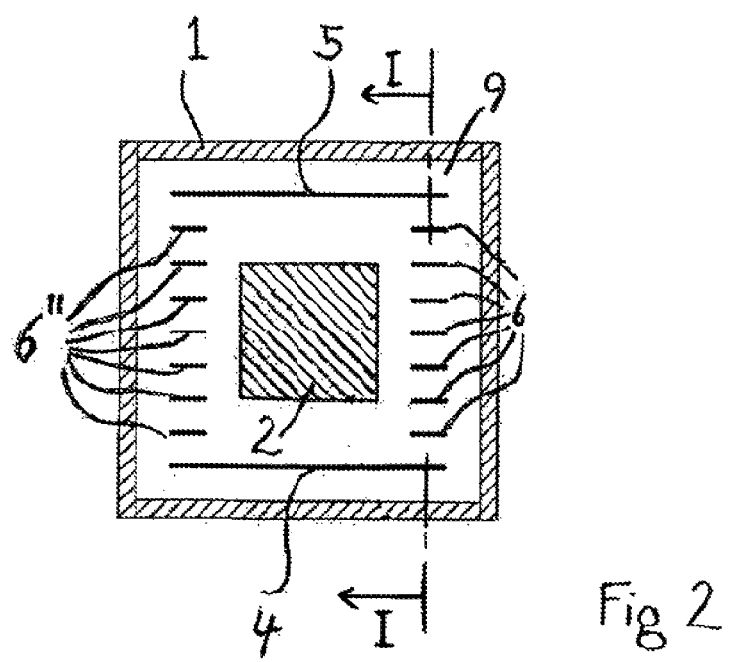
Figure 3:
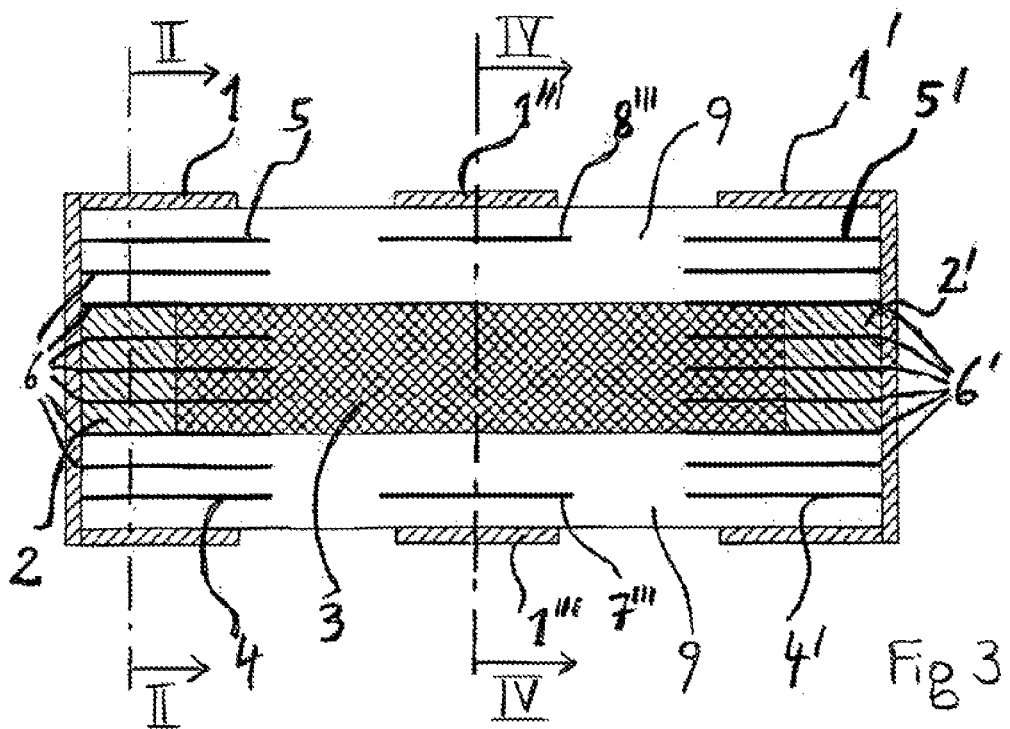
Figure 4:
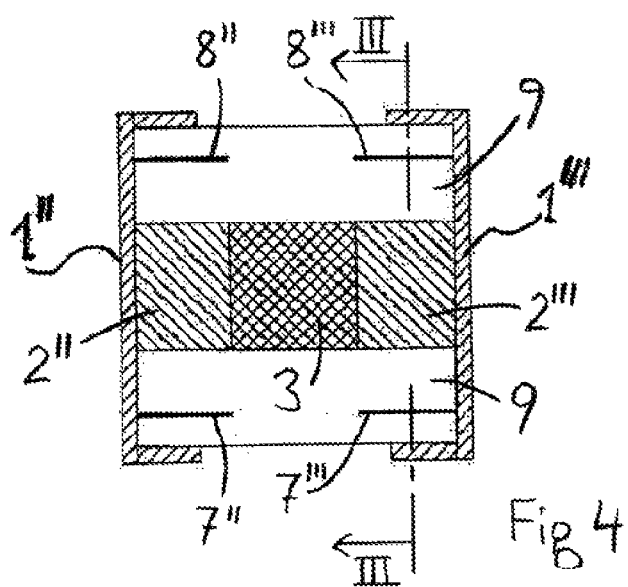
Figure 5:
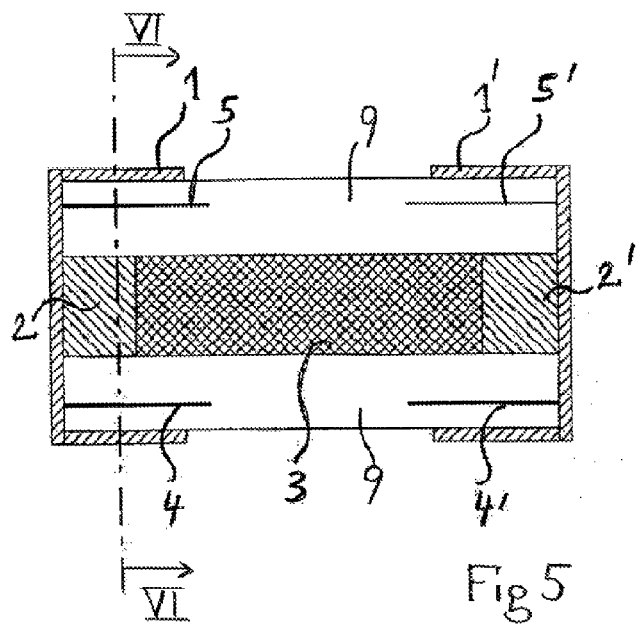
Figure 6:
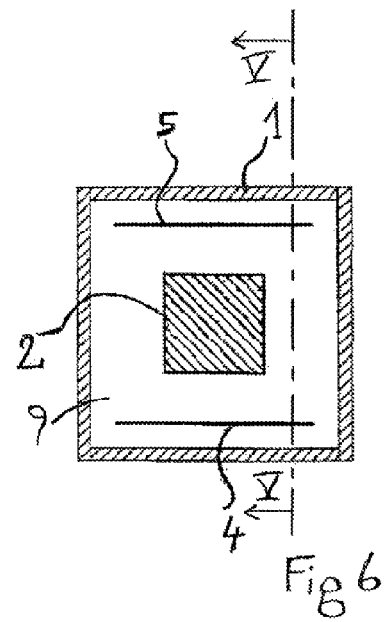
Figure 7:
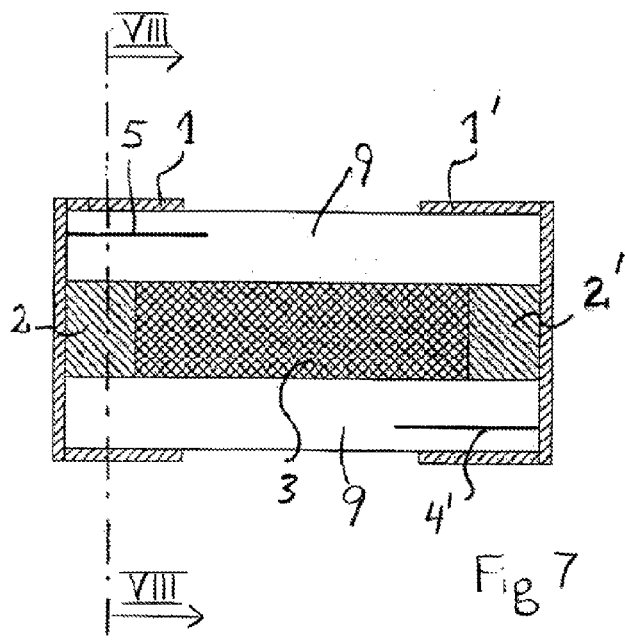
Figure 8:
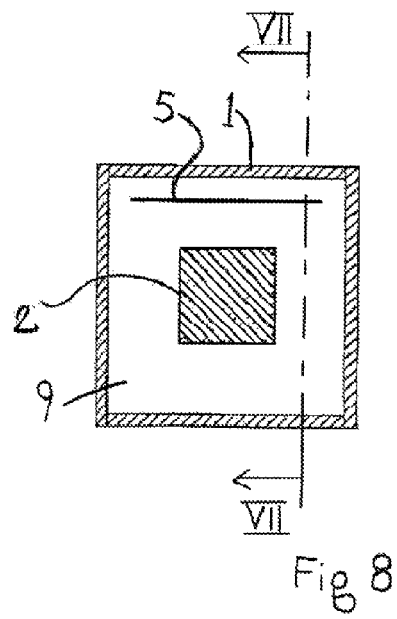

FIG. 1 shows a cross section of an embodiment of the ceramic component.
FIG. 2 shows the cross section marked in FIG. 1.
FIG. 3 shows a cross section of another embodiment.
FIG. 4 shows the cross section marked in FIG. 3.
FIG. 5 shows a cross section of another embodiment.
FIG. 6 shows the cross section marked in FIG. 5.
FIG. 7 shows a cross section of another embodiment.
FIG. 8 shows the cross section marked in FIG. 7.

In FIGS. 1, 3, 5 and 7, the components outer contact, supply region and electrodes indicated on the left-hand side each have numbers without a prime as references, while the corresponding components which are indicated on the right-hand side respectively have the same numbers with a prime (apostrophe) as references. In FIGS. 2 and 4, the components outer contact, supply region and electrodes indicated on the left-hand side, which lie behind the plane of the drawing in the views of FIGS. 1 and 3, are respectively provided with numbers with two primes as references. The components central outer contact, central supply region and central electrodes, denoted by 1''', 2''', 7''', 8''', are present in the embodiment of FIGS. 3 and 4 and lie within the plane of the drawing of FIG. 3. In FIGS. 2, 4, 6 and 8, the positions of the cross sections represented in FIGS. 1, 3, 5 and 7, respectively, are marked. The supply regions 2 and 2' and the active region 3 are also indicated in FIGS. 1, 3, 5 and 7 in order to illustrate the arrangement, although they lie behind the plane of the drawing and are covered by the material of the base body 9.

FIG. 1 shows a cross section of an embodiment of the ceramic component. The base body 9 consists mainly of a ceramic material. In the base body 9, there is an electrically active region 3, which essentially determines the function intended for the ceramic component and is constructed in a corresponding manner and, in particular, may have inner electrodes. The active region 3 may be, for example, a stack of layers which alternately consist of metal and of dielectric ceramic material. Other materials which may be used in the active region 3 are, for example, PTC material, the electrical resistance of which increases when the temperature increases, NTC material, the electrical resistance of which decreases when the temperature increases, varistor ceramic, the electrical resistance of which is voltage-dependent, ferrite, semiconductor material, polymer or the like. The inner electrodes may, for example, be arranged overlapping or engaging with one another in the manner of a comb. Such materials and arrangements are known per se from multilayer components.

The base body 9 may in principle be of any desired shape, for example cuboid and in particular elongate. In the case of an elongate base body 9, the active region 3 preferably extends in the longitudinal direction of the base body 9, which in the example of FIG. 1 extends horizontally. In this embodiment, on the end faces of the base body 9 which lie opposite one another in the longitudinal direction, there are mutually separated outer contacts 1, 1', which are each arranged on one of the end faces of the base body 9 and may in particular also cover the edges of the base body 9 there, as is shown in FIG. 1. Between the outer contacts 1, 1' and the active region 3, there is a respective supply region 2, 2' in which an electrically conductive connection extends between an electrical terminal or inner electrodes of the active region 3 and the relevant outer contact 1, 1'. This electrically conductive connection may be formed by a simple electrical conductor, for example by a conductor strip, which is structured in a metal layer, or may comprise a structure consisting of a plurality of conductors, so that for example the supply resistance can be reduced. The shading of the supply regions 2, 2' and the active region 3 in the figures indicates that these regions have an inner structure corresponding to the intended function of the component. The supply regions 2, 2' and the active region 3 are represented only schematically, and need not adopt the dimensions and boundaries indicated in the figures.

The supply regions 2, 2' are shielded by electrodes 4, 4', 5, 5', 6, 6'. The electrodes 4, 4', 5, 5', 6, 6' respectively lie next to the relevant supply region 2, 2' and are electrically conductively connected to the relevant outer contact 1, 1'. This is clear from the cross section according to FIG. 2, which is marked FIG. 1.

FIG. 2 shows the cross section marked in FIG. 1. The outer contact 1 lies on an end face of the base body 9 and may, as in the example represented, cover on all sides the edges of the base body 9 which border this end face, so that the outer contact 1 encloses the base body 9 in the region of the cross section according to FIG. 2. The supply region 2 lies in the interior of the base body 9, at a distance from the lateral, with respect to the longitudinal direction, outer sides of the base body 9 which adjoin the end face. Arranged between these lateral outer sides and the supply region 2 are the electrodes 4, 5, 6, 6", which shield the supply region 2 and are electrically conductively connected to the outer contact 1. In the example represented, the electrodes 4, 5, 6, 6" are electrically conductively connected at the end face of the base body 9 to the outer contact 1. Instead of or in addition to this, it is also possible to provide an electrically conductive connection between the electrodes 4, 5, 6, 6" and the lateral part, visible in the cross section of FIG. 2, of the outer contact 1.

The electrodes 4, 5, 6, 6" may be arranged at a distance from the supply region 2, as can be seen in FIG. 2. In this embodiment, the electrodes 4, 5, 6, 6" are formed as plates and are arranged coplanar at distances from one another, and they surround at least the supply region 2 in the lateral directions relative to the longitudinal direction, that is to say where the supply region 2 is not adjacent to the outer contact 1 or to the active region 3. It can be seen in FIG. 1 that the electrodes 4, 5, 6, 6" can extend so far into the interior of the base body 9 that they also shield a part of the active region 3.

The lower electrode 4 in FIG. 2 and the upper electrode 5 in FIG. 2 are arranged in such a way that the surface extent of these electrodes 4, 5 results in shielding of the supply region 2. The laterally arranged electrodes 6, 6" are arranged coplanar, in accordance with a layer structure of the base body 9, with the electrodes 4, 5 present above and below, at sufficiently short distances from one another so that they act as a Faraday cage and therefore lead to sufficient shielding for the intended purpose.

FIG. 3 shows a cross section of another embodiment, which has further outer contacts 1" (shown in FIG. 4) and 1'". The further outer contacts 1", 1'" are arranged, in a manner separated from the already described outer contacts 1, 1', between the mutually opposite end faces of the base body 9 in a central region, with respect to the longitudinal direction of the base body 9, and are referred to below as central outer contacts 1", 1'" in order to distinguish them from the outer contacts 1, 1' arranged on the end faces of the base body 9.

FIG. 4 shows the cross section marked in FIG. 3. It can be seen therein that, between the central outer contacts 1", 1' and the active region 3, there are respectively further supply regions 2", 2'", which connect the active region 3 to the relevant central outer contact 1", 1'". Further electrodes 7", 8", 7'", 8'", provided for electrical shielding, are arranged next to these central supply regions 2", 2'" and are electrically conductively connected to the relevant central outer contact 1", 1'". In this example, these central electrodes 7", 8", 7'", 8'" are respectively plates which are arranged above and below a layer position, occupied by the active region 3 and the central supply regions 2", 2'", of the base body 9. The central electrodes 7", 8", 7'", 8'", provided for shielding, may be arranged inside the base body 9 at distances from the central supply regions 2", 2'".

FIG. 5 shows a cross section of another embodiment, in which the arrangement of the shielding electrodes 4, 4', 5, 5' is simplified relative to the embodiment according to FIG. 1. In the embodiment according to FIG. 5, the laterally arranged electrodes 6, 6" are omitted.

FIG. 6 shows the cross section marked in FIG. 5. It can be seen therein that, in this embodiment, shielding of the supply region 2 in two mutually opposite directions is provided by means of the lower electrode 4 in FIG. 6 and the upper electrode 5 in FIG. 6.

FIG. 7 shows a cross section of another embodiment, in which the arrangement of the shielding electrodes 4', 5 is further simplified relative to the embodiment according to FIG. 5. In the embodiment according to FIG. 7, there is only an upper shielding electrode 5 at one end of the base body 9 and only a lower shielding electrode 4' at the opposite end of base body 9. The laterally arranged electrodes 6, 6" are likewise omitted here.

FIG. 8 shows the cross section marked in FIG. 7. It can be seen therein that, in this embodiment, shielding of the supply region 2 indicated on the left in FIG. 7 is provided only by means of the upper electrode 5 in FIG. 8. Shielding of the supply region 2' indicated on the right in FIG. 7 is correspondingly provided only by means of the lower electrode 4' indicated in FIG. 7.

In all the embodiments represented, there is symmetry of the arrangement of the shielding electrodes 4, 4', 5, 5', 6, 6', 6", 7", 7''', 8", 8''' with respect to the active region 3 and the supply regions 2, 2', 2", 2''' leading to the active region 3. This symmetry is mirror symmetry in the embodiments of FIGS. 1 to 6, and axial symmetry with respect to a rotation through 180° in the embodiment of FIGS. 7 and 8. The symmetry axis is perpendicular to the plane of the drawing of FIG. 7 and extends through the middle of the ceramic component.

LIST OF REFERENCES

1 outer contact
1' outer contact
1" central outer contact
1''' central outer contact
2 supply region
2' supply region
2" central supply region
2''' central supply region
3 active region
4 electrode
4' electrode
5 electrode
5' electrode
6 electrode
6' electrode
6" electrode
7" central electrode
7''' central electrode
8" central electrode
8''' central electrode
9 base body

The invention claimed is:

1. An electric ceramic component comprising:
   a base body of a dielectric material, in which an active region is arranged;
   an outer contact, which is arranged on the base body;
   a further outer contact, which is arranged on the base body on an opposite side with respect to the outer contact;
   a supply region, which connects the outer contact to the active region;
   a further supply region, which connects the further outer contact to the active region;
   an electrode, which is arranged next to the supply region in the base body and is electrically conductively connected to the outer contact, but not to the active region, the electrode electrically shielding the supply region;
   a further electrode, which is arranged next to the further supply region in the base body and is electrically conductively connected to the further outer contact, but not to the active region, the further electrode electrically shielding the further supply region;
   a central outer contact, which is arranged on the base body between the outer contact and the further outer contact;
   a central supply region, which connects the central outer contact to the active region; and
   a central electrode, which is arranged next to the central supply region in the base body and is electrically conductively connected to the central outer contact, but not to the active region, the central electrode electrically shielding the central supply region.

2. The electric ceramic component of claim 1, further comprising:
   a further central outer contact, which is arranged on the base body on an opposite side with respect to the central outer contact;
   a further central supply region, which connects the further central outer contact to the active region; and
   a further central electrode, which is arranged next to the further central supply region in the base body and is electrically conductively connected to the further central outer contact, but neither to the active region nor to the central electrode.

3. The electric ceramic component of claim 1 or 2, further comprising:
   a plurality of further electrodes, which are arranged next to the supply region in the base body and are electrically conductively connected to the outer contact, but not to the active region,
   the plurality of further electrodes being plates arranged in parallel at distances from one another, and
   the electrode and the plurality of further electrodes being arranged on sides of the supply region where the supply region adjoins neither the outer contact nor the active region, thus shielding the supply region.

4. The electric ceramic component of claim 3, further comprising:
   a further plurality of further electrodes being arranged next to the further supply region in the base body and electrically conductively connected to the further outer contact, but not to the active region,
   the further plurality of further electrodes being plates arranged in parallel at distances from one another, and
   the further electrode and the further plurality of further electrodes being arranged on sides of the further supply region where the further supply region adjoins neither the further outer contact nor the active region, thus shielding the further supply region.

* * * * *